(12) United States Patent
Hansen et al.

(10) Patent No.: US 7,315,428 B2
(45) Date of Patent: Jan. 1, 2008

(54) MAGNETIC MEDIA WRITE SIGNAL FILTER

(75) Inventors: Lawrence A. Hansen, Meridian, ID (US); Gary Bartles, Wilder, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 65 days.

(21) Appl. No.: 10/975,518

(22) Filed: Oct. 28, 2004

(65) Prior Publication Data

US 2006/0092540 A1 May 4, 2006

(51) Int. Cl.
*G11B 5/09* (2006.01)
(52) U.S. Cl. .......................... 360/46; 360/68
(58) Field of Classification Search ...................... None
See application file for complete search history.

(56) References Cited

U.S. PATENT DOCUMENTS

| | | | | |
|---|---|---|---|---|
| 4,044,387 A | * | 8/1977 | Watkins et al. ............... 360/61 |
| 5,606,250 A | * | 2/1997 | Niemann ..................... 324/127 |
| 6,169,639 B1 | * | 1/2001 | Salo et al. .................... 360/46 |
| 6,603,623 B1 | * | 8/2003 | Fontana et al. ............... 360/68 |
| 6,768,352 B1 | * | 7/2004 | Maher et al. ................ 327/112 |
| 6,952,316 B2 | * | 10/2005 | Tretter .......................... 360/31 |
| 7,006,313 B2 | * | 2/2006 | Ngo ............................ 360/46 |
| 2002/0176187 A1 | * | 11/2002 | Bishop ........................ 360/46 |

FOREIGN PATENT DOCUMENTS

JP 58012116 A * 1/1983

* cited by examiner

*Primary Examiner*—Wayne Young
*Assistant Examiner*—Varsha A. Kapadia

(57) ABSTRACT

In one embodiment, a magnetic media write signal filter includes a plurality of resistors connected in series across output signal lines of a write driver and a capacitor connected between a junction of resistors and a ground.

14 Claims, 2 Drawing Sheets

MAGNETIC MEDIA WRITE SIGNAL FILTER

BACKGROUND

Binary information is stored on magnetic media such as tapes and disks by magnetizing small areas of the magnetic surface with one of two polarities. When writing data, a current is passed through an inductive write head. A change in current from positive to negative sets the polarity of the media surface adjacent to the head to one polarity; a current transition from negative to positive sets the opposite polarity. The transition between polarities is called a flux transition. A flux transition occurring at a data bit location may represent a "one" bit, and no flux transition may represent a "zero" bit. When reading data, a magneto resistive read head passes through magnetic fields from the small magnetized areas. As the head passes through the fields, a transition from one polarity to the opposite polarity results in a resistance change in the read head.

Many modern tape drives use an array of several write heads that can operate simultaneously to write data to a tape and an array of several read heads that can operate simultaneously to read data from a tape. The magnetic heads are positioned very close to one another and the signals to one head can interfere with the signals to another head. This type of electromagnetic interference is often referred to as channel crosstalk and may arise between write heads (write-to-write channel crosstalk) or between write heads and read heads (write-to-read channel crosstalk). Channel crosstalk can arise when excessive common mode voltages are transmitted by a write current driver, which is typically a differential amplifier. The inductive write head requires and responds only to differential current provided by the write current driver. The write current driver may produce unwanted common mode voltages. The necessary component of the write signal is the differential write current and the unwanted component of the write signal is the common mode voltage. Such common mode voltages can also be the source of electromagnetic interference (EMI) or radio frequency interference (RFI) for nearby electronic devices.

DRAWINGS

Figure 1:
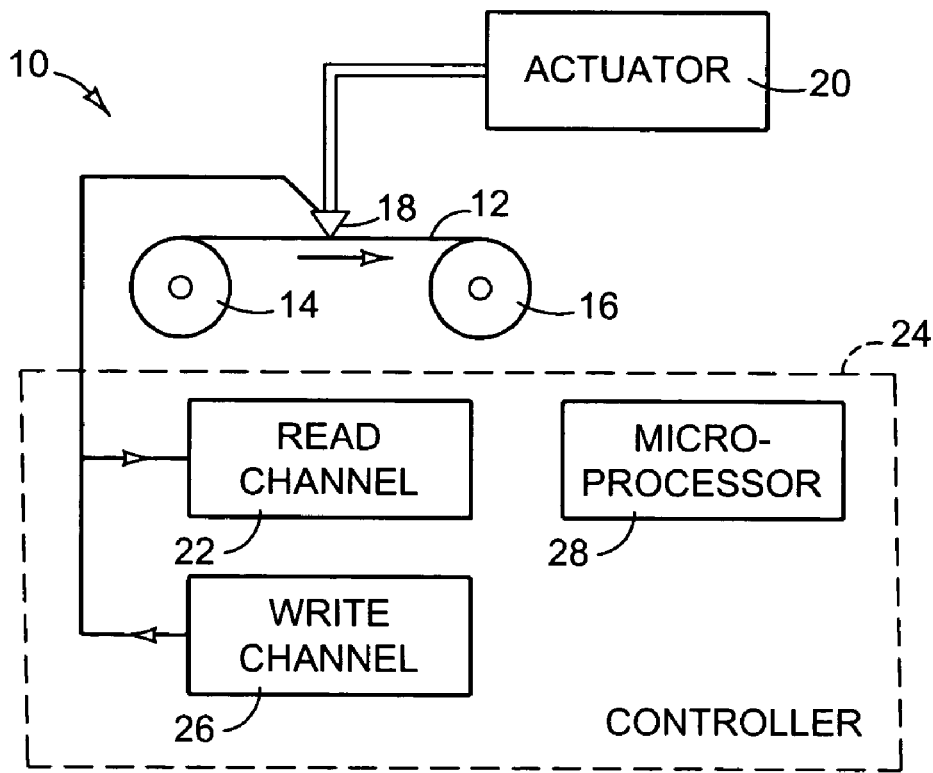
Figure 2:
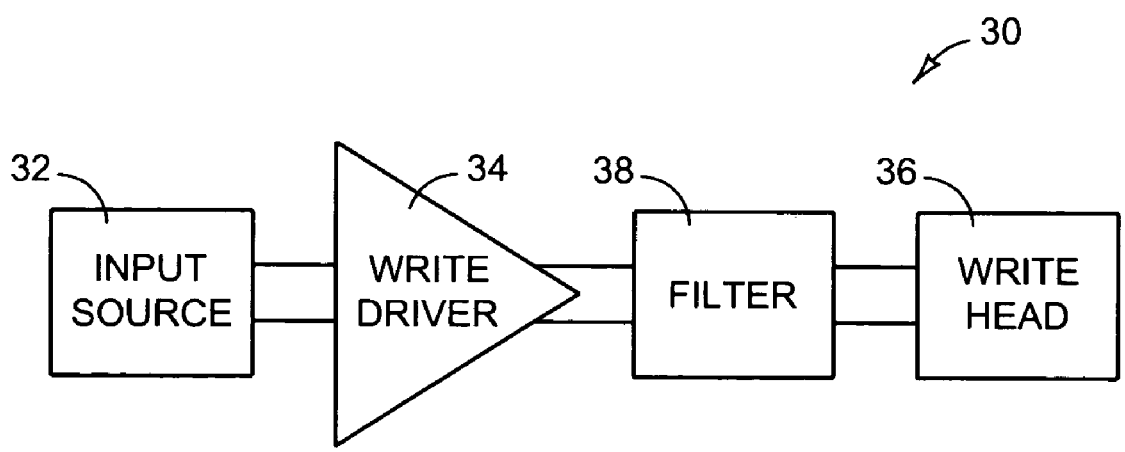
Figure 3:
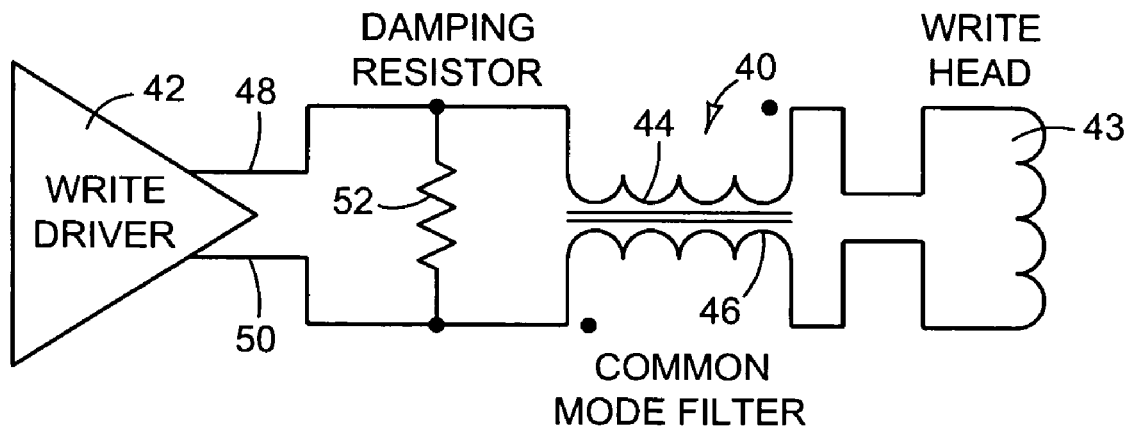
Figure 4:
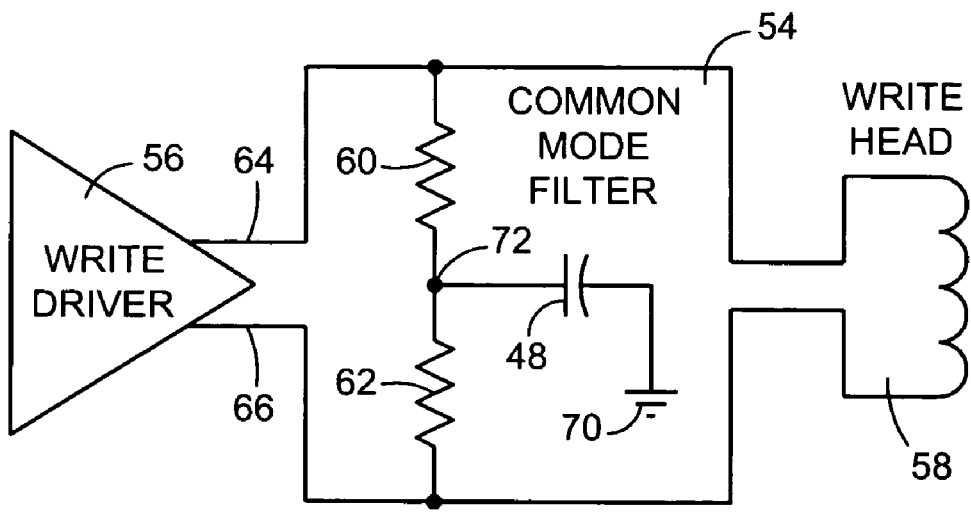

FIG. 1 is a block diagram of a magnetic tape drive.
FIG. 2 is a block diagram of a write channel.
FIG. 3 is a schematic illustrating one implementation of a common mode filter.
FIG. 4 is a schematic illustrating another implementation of a common mode filter.

DESCRIPTION

Embodiments of the present invention were developed in an effort to attenuate undesirable common mode voltages in the output signal lines of write drivers in a tape drive. Embodiments will be described, therefore, with reference to the tape drive shown in FIG. 1. Embodiments of the invention, however, are not limited to use with tape drives. Embodiments may be implemented in other magnetic storage products, such as hard disks.

FIG. 1 shows the components of a tape drive 10 associated with read and write operations. Magnetic tape 12 feeds from a supply reel 14 to a take-up reel 16, passing by a read and write head 18. An actuator 20 positions head 18 over the track to read from or write on tape 12. During a read operation, signals pass from head 18 to a read channel 22 located on a controller 24. During a write operation, signals pass from a write channel 26 to head 18. Controller 24, which includes a microprocessor 28, controls the operation of the tape drive, including reels 14 and 16, actuator 20, read channel 22 and write channel 26. Controller 24 receives read instructions, write instructions and data from a computer or other host. Microprocessor 28 represents generally one or more processors and/or application specific integrated circuits (ASICs) that may be necessary or desirable to implement the functions of controller 24. Also, although only one head 18 and associated read channel 22 and write channel 26 are shown, a typical tape drive will usually have an array of many such heads formed in a composite head structure; and the controller will include a read channel and a write channel for each head in the array. In some tape drives, separate read heads and write heads are used instead of combined read and write heads.

FIG. 2 is a block diagram illustrating a write channel 30 such as might be used for write channel 26 in tape drive controller 24 in FIG. 1. Referring to FIG. 2, a digital signal processor (DSP) or other suitable source 32 of write channel signals inputs write data signals to a write driver 34. In one embodiment, source 32 includes an ASIC configured to convert a stream of digital data from a host device into a series of signals that can be used by write driver 34 to generate a corresponding series of write currents to an inductive write head 36. "Write driver" as used in this document means any circuitry for generating alternating polarity currents that create flux transitions in an inductive head to record data on a magnetic media. Write driver 34 therefore, represents generally any suitable circuitry for generating the alternating polarity currents that create the desired flux transitions in head 36 to record data on a tape or other magnetic media. In one embodiment, write driver 34 includes a differential amplifier configured as an H-bridge circuit. Head 36 may be deemed a part of the write channel, as shown in FIG. 2, or as a separate component, as shown in FIG. 1.

A filter 38 is interposed between write driver 34 and head 36 to reduce or eliminate any common mode voltages that may be present in signals output by write driver 34. Filters are electronic circuits that change the characteristics of a signal, such as eliminating undesirable artifacts, changing pulse shape, or removing selected frequency components. Filters may be either analog filters or digital filters. An analog filter is implemented as an analog circuit and operates on an analog signal, a signal that varies continuously in time. Analog circuits typically contain elements such as resistors, capacitors, amplifiers, and the like. A digital filter is implemented as a digital circuit and operates on a digital signal, the numerical representation of a continuous time signal. Digital circuits typically contain such elements as logic gates, registers, and the like.

FIG. 3 illustrates one conventional implementation of a common mode filter 40 used for filter 38 in write channel 30 shown in FIG. 2. Referring to FIG. 3, a common mode filter 40 is located between a write current driver 42 and an inductive write head 43. Filter 40 includes choke coils 44 and 46 in driver output signal lines 48 and 50. Coils 44 and 46 may be formed by winding the respective output signal lines 48 and 50 around a single ferrite core so that coils 44 and 46 work together as an inductor to suppress common mode signals in lines 48 and 50. A damping resistor 52 is used to help control overshoot and rise-time of the differential write current in output lines 48 and 50.

Rather than using the comparatively large and expensive choke coils of conventional filters, embodiments of the present invention utilize a resistor-capacitor filter circuit to attenuate common mode voltages in the output lines of the write drivers. For example, and referring to the implementation shown in FIG. 4, a common mode filter 54 located between a write driver 56 and an inductive head 58 includes (1) a pair of resistors 60 and 62 connected in series across output signal lines 64 and 66 and (2) a capacitor 68 connected between a circuit ground 70 and the junction 72 between resistors 60 and 62. Resistors 60 and 62 along with capacitor 68 form a resistor-capacitor filter circuit that attenuates common mode voltages in output lines 64 and 66. The two resistors 60 and 62 in series provide a damping resistance to control overshoot and rise-time of the differential write current in lines 64 and 66. For the dual resistor damping of FIG. 4, each resistor 60 and 62 provides ½ the resistance of a single resistor implementation like the one shown in FIG. 3.

Write drivers have different output specifications that make them more or less suitable for certain applications. These specifications depend in some respects on the load that is presented to the write driver output. That is to say, the damping resistor, the electrical interconnections (wires, traces flex circuits, etc.) and the inductive write head all affect the integrity of the write driver signal passed to the write head. In the more recent generations of Linear Tape Open (LTO) Ultrium tape drive, for example, in which eight or sixteen write heads record data simultaneously on eight sixteen tracks, a combined damping resistance in the range of 60 ohms to 600 ohms (30 to 300 ohms for each resistor) and a capacitance in the range of 10 picofarads to 100 nanofarads should provide suitable attenuation of common mode voltages along with adequate control of overshoot and rise-time for most applications.

The exemplary embodiments shown in the figures and described above illustrate but do not limit the invention. Other forms, details, and embodiments may be made and implemented. Hence, the foregoing description should not be construed to limit the scope of the invention, which is defined in the following claims.

What is claimed is:

1. A magnetic media write signal filter, comprising:
   a plurality of resistors connected in series across two output signal lines of a write driver; and
   a capacitor connected directly between a junction of resistors in the plurality of resistors and a ground, wherein the plurality of resistors provides dampening resistance to control overshoot and rise-time of a write current in the two output signal lines.

2. The filter of claim 1, wherein the plurality of resistors comprises a pair of resistors and the capacitor is connected between the junction of the resistors and a ground.

3. A magnetic media write signal filter, comprising a resistor-capacitor circuit interposed between a write driver and an inductive write head and including a pair of resistors connected in series across two output signal lines of the write driver and a capacitor connected between a junction of the pair of resistors and a ground, the circuit configured to dampen overshoot of a differential write current in write signals and attenuate common mode voltages in the write signals.

4. The filter of claim 3, wherein a capacitance in a range of 10 picofarads to 100 nanofarads provides attenuation of the common mode voltages.

5. An electronic circuit for filtering an analog signal produced for writing data to magnetic media, the circuit comprising a resistor-capacitor filter that includes two resistors connected in series across plural output signal lines of a write driver and a capacitor connected between a junction of the two resistors and a ground, the filter being configured to dampen overshoot of a differential write current in write signals and attenuate common mode voltages in the write signals.

6. The circuit of claim 5, wherein the two resistors produce a combined damping resistance in a range of 60 ohms to 600 ohms.

7. A write channel for a magnetic storage device having an inductive write head, the write channel comprising:
   a source of input signals representing data to be recorded on a magnetic media;
   a write driver operatively connected to the source; and
   a write signal filter having two resistors connected in series across plural separate output signal lines of the write driver and a capacitor connected directly between a junction of the two resistors and a ground.

8. The write channel of claim 7, wherein the source of input signals comprises a digital signal processor.

9. The write channel of claim 7, further comprising an inductive write head operatively connected to the write driver through the filter and wherein the source of input signals comprises an application specific integrated circuit configured to convert a stream of digital data from a host device into a series of signals usable by the write driver to output a corresponding series of write signals to the head.

10. A write channel for a magnetic storage device having an inductive write head, the write channel comprising:
    a write driver having multiple output signal lines;
    an inductive write head connected to the multiple output signal lines;
    a digital signal processor operatively connected to the write driver, the digital signal processor configured to convert a stream of digital data from a host device into a series of signals usable by the write driver to output a corresponding series of write signals having alternating polarity write currents to the write head; and
    a resistor-capacitor filter interposed between the write driver and the write head, the filter including a pair of resistors connected in series across the multiple output signal lines and a capacitor connected between a junction of the pair of resistors and a ground and being configured to dampen overshoot of a differential write current in write signals output by the write driver and attenuate common mode voltages in the write signals.

11. The write channel of claim 10, wherein a capacitance in a range of 10 picofarads to 100 nanofarads provides attenuation of the common mode voltages.

12. A tape drive, comprising:
    an inductive write head;
    a tape take-up reel;
    a head actuator operative to move the write head across a tape path;
    a write channel comprising a source of input signals representing digital data to be recorded on magnetic tape, a write driver operatively connected to the source, and a signal filter having a plurality of resistors connected in series across two output signal lines of the write driver and a capacitor connected directly between a junction of resistors in the plurality of resistors and a ground; and
    an electronic controller configured to receive read and write instructions and data from a computer or other host device and to control operation of the take-up reel, the actuator, the write head, and the write channel.

13. The tape drive of claim 12, wherein the write channel is part of the controller.

14. A tape drive, comprising:
an inductive write head;
a tape take-up reel;
a head actuator operative to move the write head across a tape path;
a write channel comprising a source of input signals representing digital data to be recorded on magnetic tape, a write driver operatively connected to the source, and a resistor-capacitor filter interposed between the write driver and the write head, the filter having plural resistors connected in series across multiple output signal lines and a capacitor connected between a junction of the plural resistors and a ground, the filter being configured to dampen overshoot of a differential write current in write signals output by the write driver and attenuate common mode voltages in the write signals; and
an electronic controller configured to receive read and write instructions and data from a computer or other host device and to control operation of the take-up reel, the actuator, the write head, and the write channel.

* * * * *